(12) United States Patent
Park et al.

(10) Patent No.: US 7,659,791 B2
(45) Date of Patent: Feb. 9, 2010

(54) DOUBLE COMB GUARD TRACE PATTERN FOR REDUCING THE FAR-END CROSS-TALK AND PRINTED CIRCUIT BOARD INCLUDING THE PATTERN

(75) Inventors: Hong June Park, Pohang-si (KR); Kyoung Ho Lee, Pohang-si (KR); Hae Kang Jung, Pohang-si (KR)

(73) Assignee: Postech Foundation & Postech Academy Industry Foundation, KRX ( * ) Notice: Subject to any disclaimer, the term of this patent is extended or adjusted under 35 U.S.C. 154(b) by 54 days.

(21) Appl. No.: 11/850,142

(22) Filed: Sep. 5, 2007

(65) Prior Publication Data
US 2008/0053694 A1 Mar. 6, 2008

(30) Foreign Application Priority Data
Sep. 5, 2006 (KR) ........................ 10-2006-0084925

(51) Int. Cl.
*H01P 3/08* (2006.01)
(52) U.S. Cl. .............................. 333/1; 333/246
(58) Field of Classification Search .................. 333/1, 333/238, 246
See application file for complete search history.

(56) References Cited

U.S. PATENT DOCUMENTS

| 5,675,298 | A * | 10/1997 | Bhagwan et al. | 333/1 |
| 6,380,818 | B1 * | 4/2002 | Lee | 333/1 |
| 6,433,648 | B1 * | 8/2002 | Lee | 333/1 |
| 6,914,502 | B2 * | 7/2005 | Otsuka et al. | 333/238 |
| 2007/0236303 | A1 * | 10/2007 | Lee et al. | 333/1 |

* cited by examiner

*Primary Examiner*—Benny Lee
(74) *Attorney, Agent, or Firm*—Jae Y. Park; Kile Goekjian Reed & McManus

(57) ABSTRACT

Provided is a guard trace pattern reducing far-end crosstalk and a printed circuit board having the guard trace pattern. The guard trace pattern includes a first guard trace pattern parallel with two signal lines and a plurality of second guard trace patterns perpendicular to the first guard trace pattern to increase mutual capacitance between the two signal lines and the guard trace pattern and increase mutual capacitance between the two signal lines. The printed circuit board includes the aforementioned guard trace pattern disposed between micro strip transmission lines. A characteristic impedance of the guard trace pattern is different from a characteristic impedance of the micro strip transmission lines, and resistances having the same value as a resistance component value of the characteristic impedance of the guard trace pattern are provided to both ends of the guard trace pattern.

4 Claims, 5 Drawing Sheets

DOUBLE COMB GUARD TRACE PATTERN FOR REDUCING THE FAR-END CROSS-TALK AND PRINTED CIRCUIT BOARD INCLUDING THE PATTERN

BACKGROUND OF THE INVENTION

1. Field of the Invention

The present invention relates to a guard trace, and more particularly, to a guard trace pattern reducing far-end crosstalk.

2. Description of the Related Art

Far-end crosstalk is noise generated by electromagnetic interference between adjacent signal lines. When high-frequency signals are transmitted through two signal lines running in parallel with each other, the signals transmitted through one of the two signal lines or the two signal lines mutually interfere with each other. Due to the far-end crosstalk generated by the mutual interference, signal transmission losses increase.

Between the two signal lines, capacitive interference due to mutual capacitance and inductive interference due to mutual inductance occur. When a difference between the capacitive interference and the inductive interference occurs, the far-end crosstalk in a receiving terminal is generated.

The far-end crosstalk $V_{FEXT}(t)$ in the receiving terminal can be represented by Equation 1.

$$V_{FEXT}(t) = \frac{l}{2}\left(\frac{C_m}{C_t} - \frac{L_m}{L_s}\right)\frac{\partial V_a(t-TD)}{\partial t} \quad \text{[Equation 1]}$$

Here, $C_m$ denotes a mutual capacitance between a transmitting terminal and the receiving terminal, and $L_m$ denotes a mutual inductance between the transmitting terminal and the receiving terminal.

Referring to Equation 1, it can be seen that the far-end crosstalk $V_{FEXT}(t)$ in the receiving terminal is proportional to a value obtained by multiplying half a length of a transmission line $l$, a time derivative of a transmission signal $V_a$ consideration of a time delay TD of the transmission line ($\partial V_a(t-TD)/\partial t$), and a difference between the capacitive interference and the inductive interference.

Here, the capacitive interference is a value obtained by normalizing the mutual capacitance $C_m$ by $C_1$ (a self capacitance plus the mutual capacitance), and the inductive interference is a value obtained by normalizing the mutual inductance $L_m$ by $L_s$ (a self inductance).

In transmission lines in uniform media such as strip lines, an amount of capacitive interference and an amount of inductive interference between the strip lines are the same, so that the far-end crosstalk in the receiving terminal ideally has a value of 0. However, inductive interference between micro strip lines formed on a printed circuit board is greater than capacitive interference therebetween, so that the far-end crosstalk in the receiving terminal has a negative value.

So as not to generate the far-end crosstalk that does not have a value of 0, a guard trace is disposed between signal lines. The guard trace is a dummy signal line provided between two adjacent signal lines. The guard trace is not associated with signal transmission and performs a function of reducing mutual interference between high-speed signals transmitted through the two signal lines.

FIG. 1 illustrates a structure of a conventional guard trace.

Referring to FIG. 1, the conventional guard trace is disposed between two signal lines Aggressor-line and Victim-line. In FIG. 1, Aggressor line is a transmission line which a signal is applied to an end thereof, Victim-line is a transmission line which a signal is not applied to an end thereof. In addition, $V_{sl}$ is a source voltage, $V_{al}$ is a Aggressor voltage, $V_{fe}$ is a far-end crosstalk voltage. And TD is a Propagation Time Delay. Resistances (hereinafter, referred to as terminal resistances R0) provided to both ends of the two signal lines have the same resistance value as a resistance component of characteristic impedances (Z) of the signal lines. A resistance value R0 of the terminal resistance of the guard trace is the same as that of the two signal lines.

FIG. 2 is a cross-sectional view illustrating a printed circuit board including the guard trace illustrated in FIG. 1. The printed circuit board, for example, a "FR4" (Flame Retardant 4) board of which dielectric constant ($\in$) is 4.5. The printed circuit board may be a board of which dielectric thickness is 8 mil bottom copper thickness is 1.4 mil, and upper copper thickness is 0.7 mil. Referring to FIG. 2, the conventional Aggressor-line, Victim-Line and guard trace have a width of 14 mil and a thickness of 0.7 mil. The guard trace, Aggressor-line, and Victim-line are separated each other at an interval of 14 mil. Here, 1 mil denotes $\frac{1}{1000}$ inch.

The conventional guard trace has an advantage of reducing a value of the mutual inductance. However, only a part of the amount of the far-end crosstalk in the receiving terminal is reduced, so that a system performance cannot be significantly increased.

SUMMARY OF THE INVENTION

The present invention provides a guard trace pattern capable of effectively reducing far-end crosstalk in a receiving terminal.

The present invention also provides a printed circuit board having a guard trace pattern capable of reducing far-end crosstalk in a receiving terminal.

According to an aspect of the present invention, there is provided a guard trace pattern including a first guard trace pattern parallel with two signal lines and a plurality of second guard trace patterns perpendicular to the first guard trace pattern to increase mutual capacitance between the two signal lines and the guard trace pattern and increase mutual capacitance between the two signal lines.

According to another aspect of the present invention, there is provided a printed circuit board including the aforementioned guard trace pattern disposed between micro strip transmission lines. A characteristic impedance of the guard trace pattern is different from a characteristic impedance of the micro strip transmission lines, and resistances having the same value as a resistance component value of the characteristic impedance of the guard trace pattern are provided to both ends of the guard trace pattern.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described in detail with reference to the attached drawings.

Figure 1:
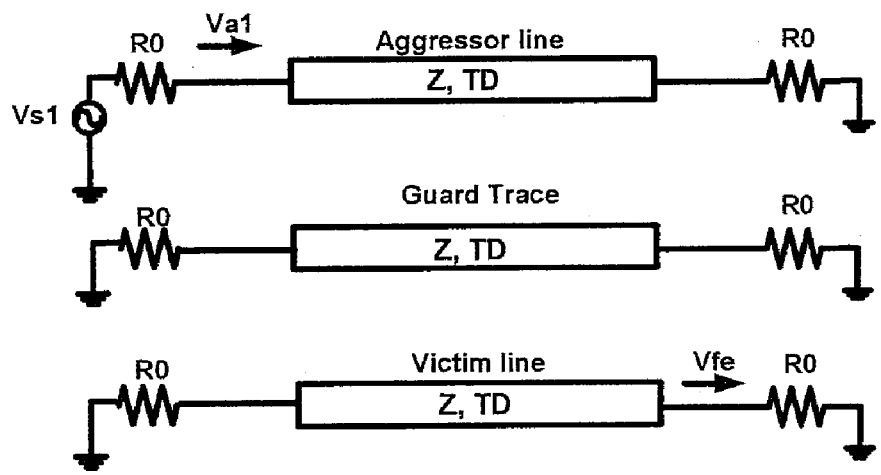
FIG. 1 illustrates a structure of a conventional guard trace.
Figure 2:
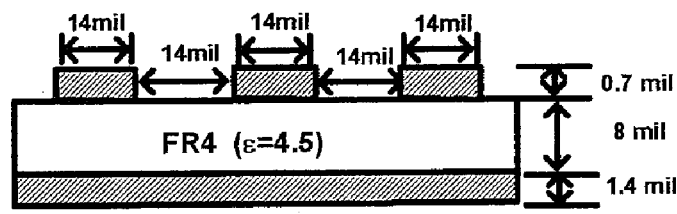
FIG. 2 is a cross-sectional view illustrating a printed circuit board (PCB) including the guard trace illustrated in FIG. 1.
Figure 3:
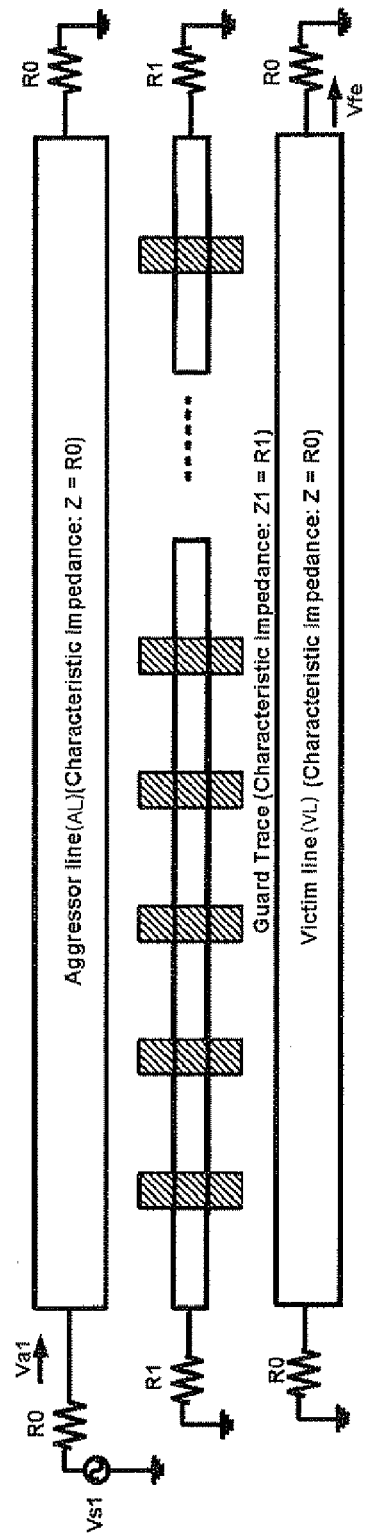
FIG. 3 illustrates a guard trace pattern according to an embodiment of the present invention.

FIG. 3 illustrates a guard trace pattern according to an embodiment of the present invention.

Referring to FIG. 3, the guard trace pattern further includes traces (hatched portions) in a vertical direction in addition to a conventional straight trace. Here, for example, the characteristic impedance Z0 of the Aggressor-line and Victim-line has a matching value equal to the terminal resistor R0 to reduce reflected waves. In addition, $V_{sl}$ is a source voltage, $V_{al}$ is a aggressor voltage, and, $V_{fe}$ far-end crosstalk voltage. TD is a Propagation Time Delay. The added traces in the vertical direction increase mutual capacitance between two signal lines Aggressor line (referred to as AL) and Victim Line (referred to as VL). At both ends of the guard trace, resistances R1 having the same value as a resistance component included in a characteristic impedance Z1 of the guard trace are provided in order to minimize reflected waves that occur in the guard trace.

Figure 4:
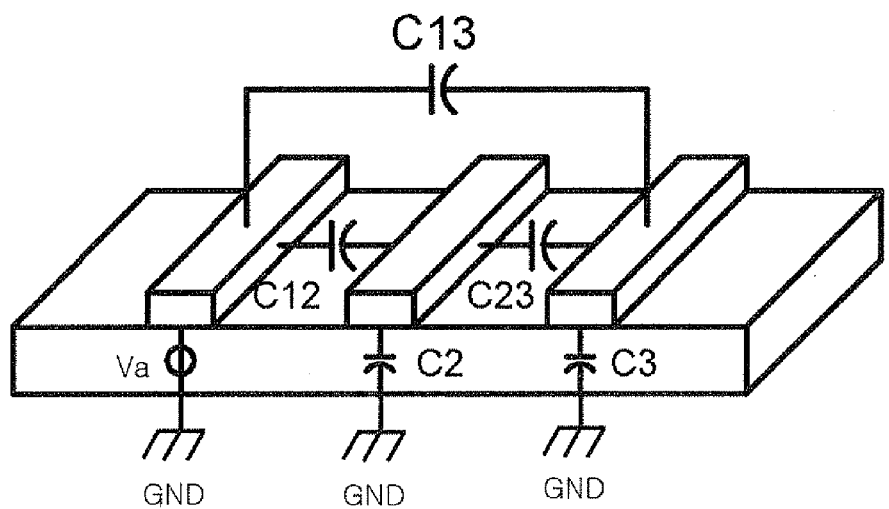
FIG. 4 is a cross-sectional view illustrating a PCB including a guard trace pattern and two signal lines according to an embodiment of the present invention.

FIG. 4 is a cross-sectional view illustrating a PCB including a guard trace pattern and two signal lines according to an embodiment of the present invention;

Referring to FIG. 4, the guard trace is disposed between two signal lines. A self capacitance of the guard trace is C2, and a self capacitance of the right signal line is C3. An input signal Va is applied between a ground voltage GND and the left signal line, so that a self capacitance of the left signal line is omitted. A mutual capacitance between the left signal line and the guard trace is denoted by C12, a mutual capacitance between the guard trace and the right signal line is denoted by C23, and a mutual capacitance between the left signal line and the right signal line is denoted by C13.

Figure 5:
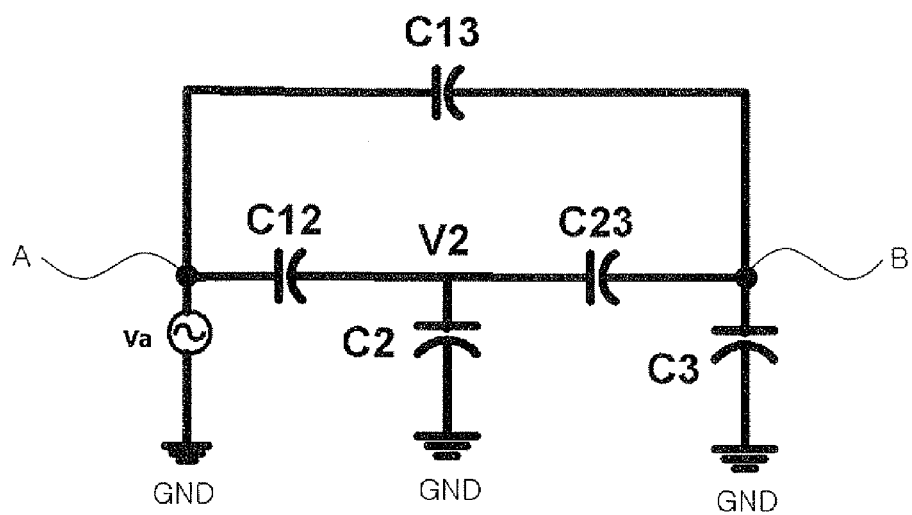
FIG. 5 illustrates a capacitance equivalent circuit of the guard trace pattern and the two signal lines illustrated in FIG. 4 according to an embodiment of the present invention.

FIG. 5 illustrates a capacitance equivalent circuit of the guard trace pattern and the two signal lines illustrated in FIG. 4 according to the embodiment of the present invention. In FIG. 5, $V_a$ is a voltage of node A, $V_2$ is a voltage of $C_2$, $C_3$ is a self capacitance.

Referring to FIG. 5, in consideration of a current flowing between a first node voltage A and a second node voltage B, a mutual capacitance Cm between the two nodes can be represented by Equation 2.

$$C_m = C_{13} + \frac{C_{12}C_{23}}{C_2 + C_{12} + C_{23}}$$ [Equation 2]

In order to increase the mutual capacitances $C_{12}$ and $C_{23}$, the guard trace pattern according to the embodiment of the present invention further includes a guard trace pattern in the vertical direction in addition to the conventional guard trace. In this case, the self capacitance $C_2$ of the guard trace is increased, and the mutual capacitances $C_{12}$ and $C_{23}$ are also increased. Since the guard trace pattern in the vertical direction is close to the adjacent signal line, the mutual capacitance between the signal line and the guard trace pattern in the vertical direction is greater than that between the signal line and the guard trace pattern in the horizontal direction. Therefore, the mutual capacitances $C_{12}$ and $C_{23}$ can also be increased Referring to Equation 2, since an increment of a numerator is greater than an increment of a denominator of the mutual capacitance Cm between the two nodes, the value of the mutual capacitance Cm is increased. Here, in order to decrease the self capacitance $C_2$ of the guard trace pattern, a width of the guard trace pattern may be reduced.

The conventional guard trace has a disadvantage in that absolute values of the mutual capacitances $C_{12}$, $C_{23}$ are small, so that the mutual capacitance Cm cannot be significantly increased although the self capacitance $C_2$ is high.

As the number of the guard trace patterns in the vertical direction added to the guard trace pattern in the horizontal direction increases, the mutual capacitances increase. However, intervals between the guard trace patterns less than a predetermined level are not effective to increase the mutual capacitance. According to experiments, an interval of 100 mil between the guard trace patterns is the most effective value (see FIG. 6).

When a pair of two signal lines is operated, a speed difference between in an even mode and in an odd mode occurs due to the mutual inductance and the mutual capacitance. Here, in the even mode, two signals are transited to the same direction, and in the odd mode, the two signals are transited to different directions. For example, in the even mode, signals transmitted through the two signal lines are transited from a logic high state to a logic low state, or the signals transmitted through the two signal lines are transited from the logic low state to the logic high state. In the odd mode, one of the two signal lines is transited from the logic low state to the logic high state, and the other signal line is transited from the logic high state to the logic low state.

In the even mode and the odd mode, capacitances, inductances, and time delays according to the capacitances and the inductances can be represented by Equation 3.

$$C_{odd} = C_s + 2C_m$$ [Equation 3]

$$L_{odd} = L_s - L_m$$

$$C_{even} = C_s$$

$$L_{even} = L_s + L_m$$

$$TD_{odd} = \sqrt{C_{odd}L_{odd}}$$

$$TD_{even} = \sqrt{C_{even}L_{even}}$$

here, $C_s$ is a self capacitance, $L_s$ is a self Inductance, $L_m$ is a mutual inductance, $L_{even}$ is an even mode inductance and $L_{odd}$ is a odd mode inductance.

In micro strip transmission lines in a general printed circuit board, a time delay TDodd in the odd mode is smaller than a time delay TDeven in the even mode. A difference between the time delays generates significant jitter, and this may cause a problem in transmission signal integrity of high-speed signals.

However, referring to Equation 3, the capacitance Codd in the odd mode, which determines the time delay TDodd in the odd mode is increased as the mutual capacitance Cm increases. On the other hand, the capacitance Ceven in the even mode, which determines the time delay TDeven in the even mode, is not changed. Therefore, when the guard trace pattern according to the embodiment of the present invention is used, the difference between the time delay TDodd in the odd mode and the time delay TDeven in the even mode can be decreased, so that jitter can be reduced.

In order to prove a performance of the guard trace pattern according to the embodiment of the present invention, the guard trace pattern is implemented in the printed circuit board. Experiments are performed on a printed circuit board without a guard trace, a printed circuit board including the conventional guard trace, and a printed circuit board including the guard trace pattern according to the embodiment of the present invention. With an interval of 20 inch between signals, far-end crosstalk noise voltages Vfext in the receiving terminal are measured.

Figure 6:
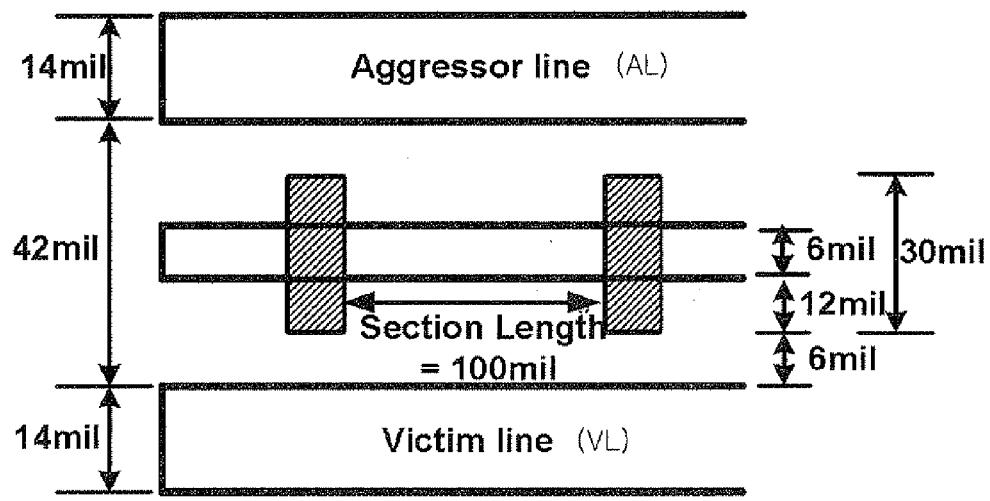
FIG. 6 illustrates a practical standard of a guard trace pattern practically manufactured to prove an effect of the guard trace pattern according to an embodiment of the present invention.

FIG. 6 illustrates a practical standard of a guard trace pattern practically manufactured to prove an effect of the guard trace pattern according to the embodiment of the present invention. In FIG. 6, Aggressor line is a transmission line which a signal is applied to an end thereof, Victim line is a transmission line which a signal is not applied to an end thereof. The Section Length in FIG. 6 represents a distance between the traces (hatched portions) in a vertical direction.

Referring to FIG. 6, when a thickness of each of two signal lines AL and VL is 14 mil and an interval between the two signal lines is 42 mil, a thickness of the guard trace pattern parallel with the two signal lines AL and VL is 6 mil, and a length of a guard trace pattern (hatched portion) in the vertical direction is 30 mil. An interval between the guard trace patterns in the vertical direction is 100 mil, and an interval between the guard trace pattern in the vertical direction and each of the two signal lines AL and VL is 6 mil.

Figure 7:
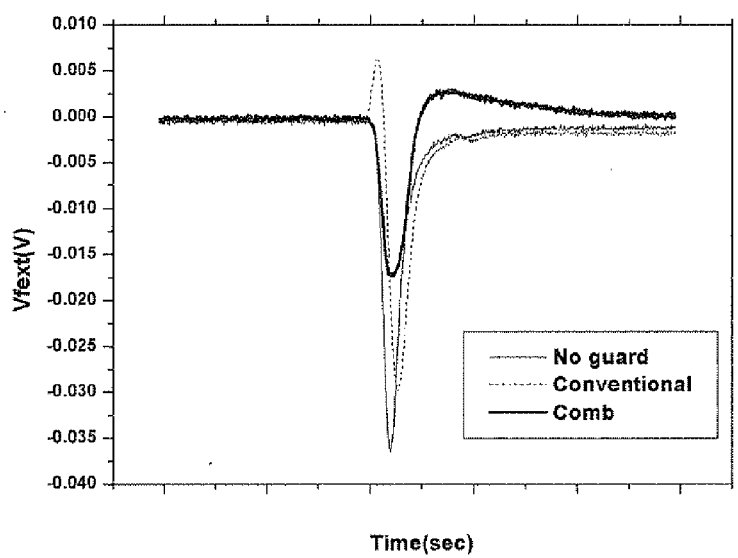
FIG. 7 illustrates far-end crosstalk voltages in receiving terminals in cases where a guard trace is not used, a conventional guard trace is used, and a guard trace pattern according to an embodiment of the present invention is used.

Referring to FIG. 7, the far-end crosstalk Vfext that occurs in the case where the conventional guard trace is used (dotted line) is reduced as compared with the far-end crosstalk that occurs in the case where the guard trace is not used (thin line). Particularly, it can be seen that the far-end crosstalk that occurs in the case where the guard trace pattern according to the embodiment of the present invention is used (thick line, Comb, here, 'Comb' denotes and is equal to the Double Comb of the present invention) is about 60% of the far-end crosstalk that occurs in the case where the conventional guard trace is used (dotted line). The graphs of FIG. 7 show TDR results, where the x-axis (or Time (sec)) represents time (sec) and the y-axis (or $V_{fext}(V)$) represents voltage.

Referring to FIG. 7, the far-end crosstalk Vfext that occurs in the case where the conventional guard trace is used (dotted line) is reduced as compared with the far-end crosstalk that occurs in the case where the guard trace is not used (thin line). Particularly, it can be seen that the far-end crosstalk that occurs in the case where the guard trace pattern according to the embodiment of the present invention is used (thick line) is about 60% of the far-end crosstalk that occurs in the case where the conventional guard trace is used (dotted line).

Jitter that occurs due to interference between the signal lines is measured when a digital data signal is transmitted at a speed of 2.5 Gbps.

Figure 8:
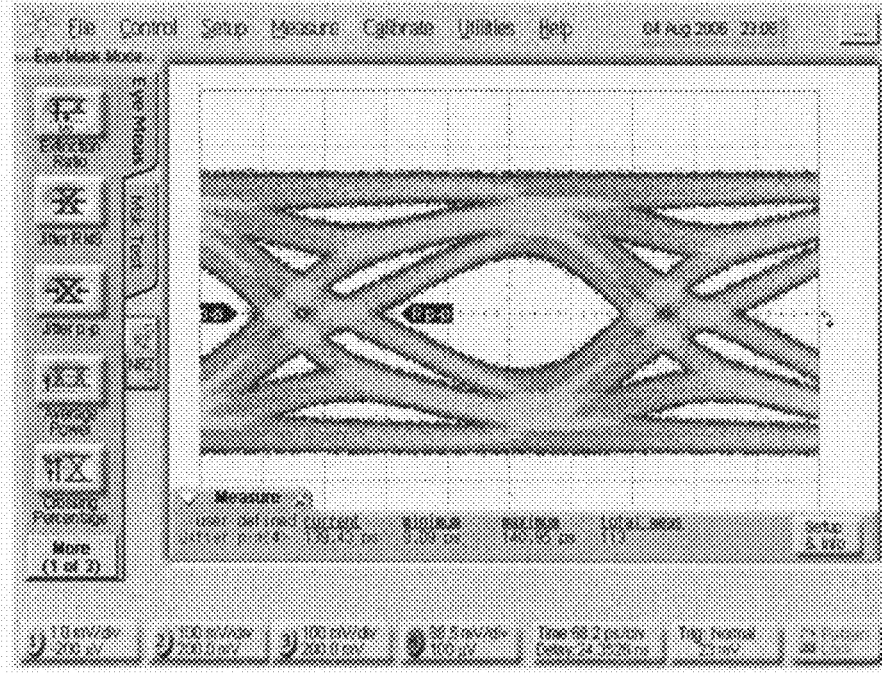
FIG. 8 illustrates jitter measured when the conventional guard trace is used.

FIG. 8 illustrates jitter measured when the conventional guard trace is used.

Figure 9:
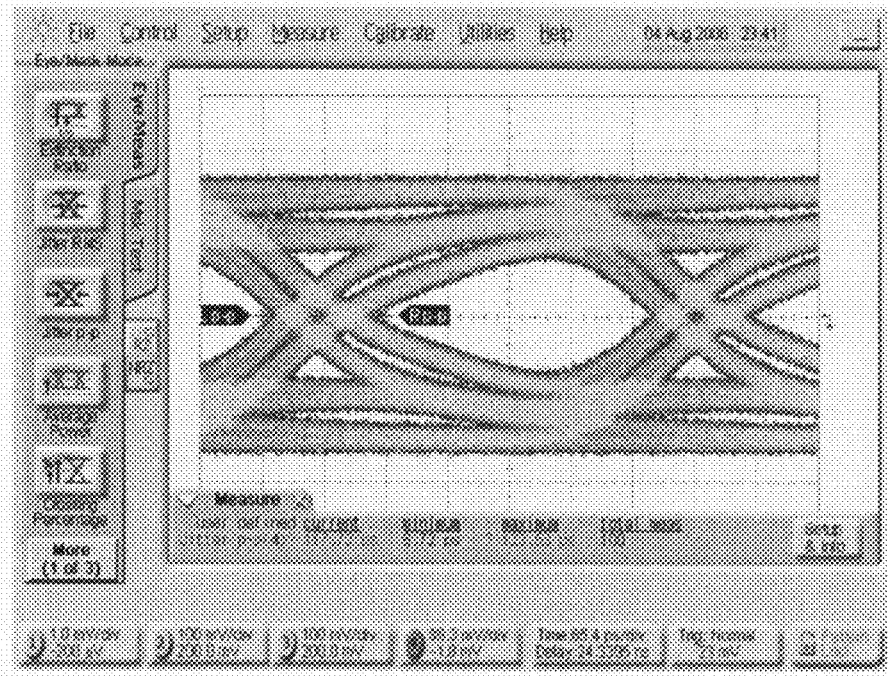
FIG. 9 illustrates jitter measured when the guard trace pattern according to an embodiment of the present invention is used.

FIG. 9 illustrates jitter measured when the guard trace pattern according to the embodiment of the present invention is used.

Referring to FIGS. 8 and 9, when the conventional guard trace is used, maximum jitter occurs at 140.95 pico-seconds and a voltage of about 119 mV. On the other hand, when the guard trace pattern according to the embodiment of the present invention is used, maximum jitter occurs at 123.53 ps and a voltage of about 100 mV. Therefore, jitter that occurs in the case where the guard trace pattern according to the embodiment of the present invention is used can be reduced as compared with jitter that occurs in the case where the conventional guard trace pattern is used, so that high-speed signal transmission can be improved.

As described above, the guard trace pattern and the printed circuit board including the guard trace pattern according to the embodiment of the present invention increases the mutual capacitance between two signal lines, so that the far-end crosstalk in the receiving terminal can be reduced.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A guard trace pattern disposed between two signal lines to reduce interference between signals transmitted through the two signal lines, comprising guard trace patterns for increasing mutual capacitance between the two signal lines by increasing mutual capacitance between the guard trace pattern and the two signal lines, wherein the guard trace patterns comprise a first guard trace pattern parallel with the two signal lines; and a plurality of second guard trace patterns perpendicular to the first guard trace pattern, wherein the first guard trace pattern and a plurality of the second guard trace patterns overlap so as to have a shape of a double comb.

2. The guard trace pattern of claim 1, wherein a distance between the second guard trace patterns and the number of the second guard trace patterns are based on thicknesses of the two signal lines and a thickness of the first guard trace pattern.

3. The guard trace pattern of claim 2, wherein the thickness of the first guard trace pattern and thicknesses of the second guard trace patterns are the same.

4. The guard trace pattern of claim 3, wherein the thickness of the first guard trace pattern is smaller than the thicknesses of the second guard trace patterns.

* * * * *